(12) United States Patent
Ozawa et al.

(10) Patent No.: US 7,649,172 B2
(45) Date of Patent: Jan. 19, 2010

(54) CHARGED PARTICLE BEAM EQUIPMENT WITH MAGNIFICATION CORRECTION

(75) Inventors: Masaru Ozawa, Hitachinaka (JP); Hiromi Inada, Hitachinaka (JP); Daisuke Terauchi, Hitachinaka (JP); Hiroyuki Tanaka, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 234 days.

(21) Appl. No.: 11/798,770

(22) Filed: May 16, 2007

(65) Prior Publication Data
US 2008/0067380 A1 Mar. 20, 2008

(30) Foreign Application Priority Data
May 16, 2006 (JP) ............................. 2006-136289

(51) Int. Cl.
*H01J 37/26* (2006.01)
*G01N 13/12* (2006.01)
(52) U.S. Cl. .................. 250/306; 250/307; 250/309; 250/310; 250/492.2; 250/492.3
(58) Field of Classification Search ................ 250/306, 250/307, 309, 310, 311, 396 R, 492.2, 492.21, 250/492.3, 305, 491.1, 492.1; 356/401; 430/296, 430/297, 298
See application file for complete search history.

(56) References Cited
U.S. PATENT DOCUMENTS 4,818,873 A * 4/1989 Herriot ....................... 250/310
6,465,781 B1 * 10/2002 Nishimura et al. ........... 250/306
6,897,956 B2 * 5/2005 Noguchi et al. .............. 356/401
2005/0189501 A1 * 9/2005 Sato et al. ................ 250/492.22
2006/0038125 A1 * 2/2006 Tsuneta et al. ............... 250/310
2006/0151697 A1 7/2006 Inada et al.
2006/0219908 A1 * 10/2006 Inada et al. .................. 250/310
2008/0232713 A1 * 9/2008 Iizuka ......................... 382/281

FOREIGN PATENT DOCUMENTS

JP 2005-209488 A 8/2005

OTHER PUBLICATIONS

Japanese Office Action issued Apr. 7, 2009.

* cited by examiner

*Primary Examiner*—Jack I Berman
*Assistant Examiner*—Nicole Ippolito Rausch
(74) *Attorney, Agent, or Firm*—Crowell & Moring LLP

(57) ABSTRACT

Charged particle beam equipment enables the simultaneous measurement and correction of magnification errors in both X and Y directions in one measurement without requiring the elimination of displacement, if any, in rotation direction between the direction of a periodic structure pattern of a sample having a known periodic structure and the X or Y direction on an electron image of the sample. The charged particle beam equipment of the invention enables the simultaneous measurement of magnification errors in the X and Y directions by FFT transformation and coordinate transformation of an electron image, even when there is a displacement in rotation direction between the direction of the periodic structural pattern and the X or Y direction on the electron image of the sample.

14 Claims, 8 Drawing Sheets

PERIODIC STRUCTURE SAMPLE

FOURIER-TRANSFORMED IMAGE
OF THE PERIODIC STRUCTURE SAMPLE

LATTICE IMAGE OF A SILICON
SINGLE-CRYSTAL THIN-FILM

ENLARGED IMAGE OF THE PERIODIC STRUCTURE SAMPLE
FOR MAGNIFICATION CALIBRATION

IDEAL COORDINATE SYSTEM OF GOLD

MEASUREMENT COORDINATE SYSTEM OF GOLD

| DISPLAY MAGNIFICATION | X MAGNIFICATION | X MAGNIFICATION ERROR $\varepsilon_x$ | Y MAGNIFICATION | Y MAGNIFICATION ERROR $\varepsilon_y$ |
|---|---|---|---|---|
| 1000 | 1005 | +0.005 | 1010 | +0.01 |
| 10000 | 10010 | +0.001 | 9950 | -0.005 |
| 50000 | 49902 | -0.002 | 50550 | +0.011 |
| 100000 | 102200 | +0.022 | 103630 | +0.036 |
| ... | ... | ... | ... | ... |
| 1000000 | 1045400 | +0.045 | 1014200 | +0.014 | ns # CHARGED PARTICLE BEAM EQUIPMENT WITH MAGNIFICATION CORRECTION

BACKGROUND OF THE INVENTION

1. Field of the Invention

The present invention relates to charged particle beam equipment that scans a sample with a charged particle beam to form an image based on signals produced by the sample by the charged particle beam irradiation. Particularly, the invention relates to charged particle beam equipment capable of correcting magnification errors.

2. Background Art

Examples of equipment for observing a magnified image of a sample using a charged particle beam include the scanning electron microscope, the scanning transmission electron microscope, and the focused ion beam (FIB) system. In such charged particle beam equipment, observation magnification is defined by the ratio of the amount of scan of the sample surface with the charged particle beam to a magnified image based on the detection of secondary electrons or the like obtained from the scanned area. The amount of scan of the sample surface with the charged particle beam can be changed as desired through the magnitude of an electric or magnetic field that is caused to act on the charged particle beam by a scan mechanism. For example, in the case of a scanning electron microscope that employs electrons as a charged particle and which uses magnetic fields as an electromagnetic lens and an electron scanning mechanism, the magnification of a secondary electron image of the sample can be changed by changing the magnitude of the current applied to the electron beam scanning coil so as to change the area of the sample scanned with the electron beam. By reducing the electron-beam-scanned area on the sample, the magnification of the secondary electron image increases; by increasing the area, the magnification decreases.

In conventional charged particle beam equipment, such as the scanning electron microscope or the focused ion beam system, in order to measure the amount of scan by the charged particle beam, i.e., the magnification of a sample magnified image, accurately, the spacing size that indicates size characteristics is measured using a scanning secondary electron image or a scanning transmission electron image of a microscale sample having a known size or a crystal lattice. Any discrepancy between the reference size value and a measured value is given as a discrepancy in magnification, or a magnification error. Methods for such size measurement include a method by which a cursor is aligned with two points to be measured on an electron image to measure the size between the two points, and a method by which the size is measured through frequency analysis of an electron image by a Fourier transform (FFT). Patent Document 1, for example, discloses a technique for measuring the size through frequency analysis of an electron image by a Fourier transform (FFT).

Patent Document 1: JP Patent Publication (Kokai) No. 2005-209488 A

DISCLOSURE OF THE INVENTION

Problems to be Solved by the Invention

However, in the aforementioned conventional methods, when measuring the size, the direction of the periodic structure pattern of the measured sample needs to be aligned with an X direction or a Y direction on an electron image so as to eliminate any displacement in the rotation direction. In order to eliminate the rotation direction displacement, image rotation is performed by beam scanning (raster rotation function), for example. This, however, has problems, such as the inability to measure magnification error with high accuracy due to errors in the image rotation circuit.

Furthermore, in conventional magnification error measurement, when measuring magnification errors in the X direction and the Y direction, since the direction of the periodic structure pattern of the measured sample and the X direction of the electron image of the sample need to be aligned with each other first, magnification error cannot be measured with high accuracy due to errors in the image rotation circuit. In addition, if magnification error in the Y direction is to be measured following the measurement of magnification error in the X direction, image rotation needs to be performed again. Thus, magnification errors in the X direction and the Y direction cannot be measured simultaneously.

While one might propose mechanically rotating the sample, it is difficult to take out, re-insert, and rotate the sample in an appropriate direction because the sample is retained in vacuum. It is difficult to mechanically rotate the sample in a target direction because the structural pattern of the sample is so small that it cannot be readily observed visually or with an optical microscope or the like.

In view of the foregoing problems, it is an object of the invention to enable simultaneous measurement and correction of magnification errors in both the X direction and the Y direction in charged particle beam equipment, without the need to eliminate any displacement in rotation direction between the direction of the periodic structure pattern of a sample having a known periodic structure and the X direction or the Y direction on an electron image of the sample.

Means of Solving the Problems

In order to achieve the aforementioned object, the present invention provides charged particle beam equipment characterized in that magnification errors in both X direction and Y direction can be simultaneously measured by FFT transformation and coordinate transformation of an electron image even when there is a displacement in rotation direction between the direction of the periodic structure pattern of a sample having a known periodic structure and the X or Y direction on the electron image of the sample.

Specifically, the invention provides charged particle beam equipment for irradiating an observed sample with a charged particle beam that is moved in a scanning motion in an X direction and a Y direction to obtain an image of the observed sample. The equipment comprises magnification error value storage means in which magnification error values in the X direction and the Y direction are stored, and data-processing means for obtaining correction subject information from the observed sample and correcting it using the magnification error values stored in the magnification error value storage means. The magnification error values are calculated by subjecting an image obtained by imaging a standard size sample having a periodic structure with a known periodic pitch to FFT (fast Fourier transform) and by performing coordinate transformation in the FFT spatial domain, and are then stored in the magnification error value storage means.

Other features of the invention will be apparent from the ensuing description of the best mode of carrying out the invention and drawings attached.

EFFECTS OF THE INVENTION

In accordance with the invention, it becomes possible, in charged particle beam equipment, to measure magnification errors in both X and Y directions simultaneously and correct them in one measurement without eliminating the displacement, if any, in rotation direction, between the direction of the periodic structure pattern of a sample having a periodic structure and the X- or Y direction on an electron image of the sample.

DESCRIPTION OF THE REFERENCE NUMERALS

1: charged particle beam source, 2: acceleration electrode, 3: charged particle beam, 4: first condenser electromagnetic lens, 5: second condenser electromagnetic lens, 6: scanning coil, 7: deflecting coil, 8: sample secondary electron, 9: object electromagnetic lens, 10: sample base, 11: sample, 12: sample forward-scattering electron, 13: sample transmission electron, 14: sample forward-scattering electron detector, 15: sample transmission electron detector, 16: fluorescent substance, 17: photomultiplier tube, 18: charged particle beam source power supply, 19: acceleration high voltage power supply, 20: sample movement device, 21: voltage stabilizer, 22: voltage stabilizer, 23-25: electromagnetic lens power supply, 26-28: coil power supply, 29-31: low current amplifier, 32-40: digital-analog converter (DAC), 41-43: analog-digital converter (ADC), 44: microprocessor, 45: data storage device, 46: periodic image data-processing section, 47: deflecting system control section, 48: correction data table, 49: magnification comparator, 51-52: interface, 53-54: rotary encoder, 55: keyboard, 56: display device driver, 57: display device, 58: electron ray optical axis, 59: upper scanning coil, 60: lower scanning coil, 61: X scanning coil, 62: Y scanning coil

BEST MODE OF CARRYING OUT THE INVENTION

In the following, embodiments of the invention are described with reference to the drawings.

Figure 1:
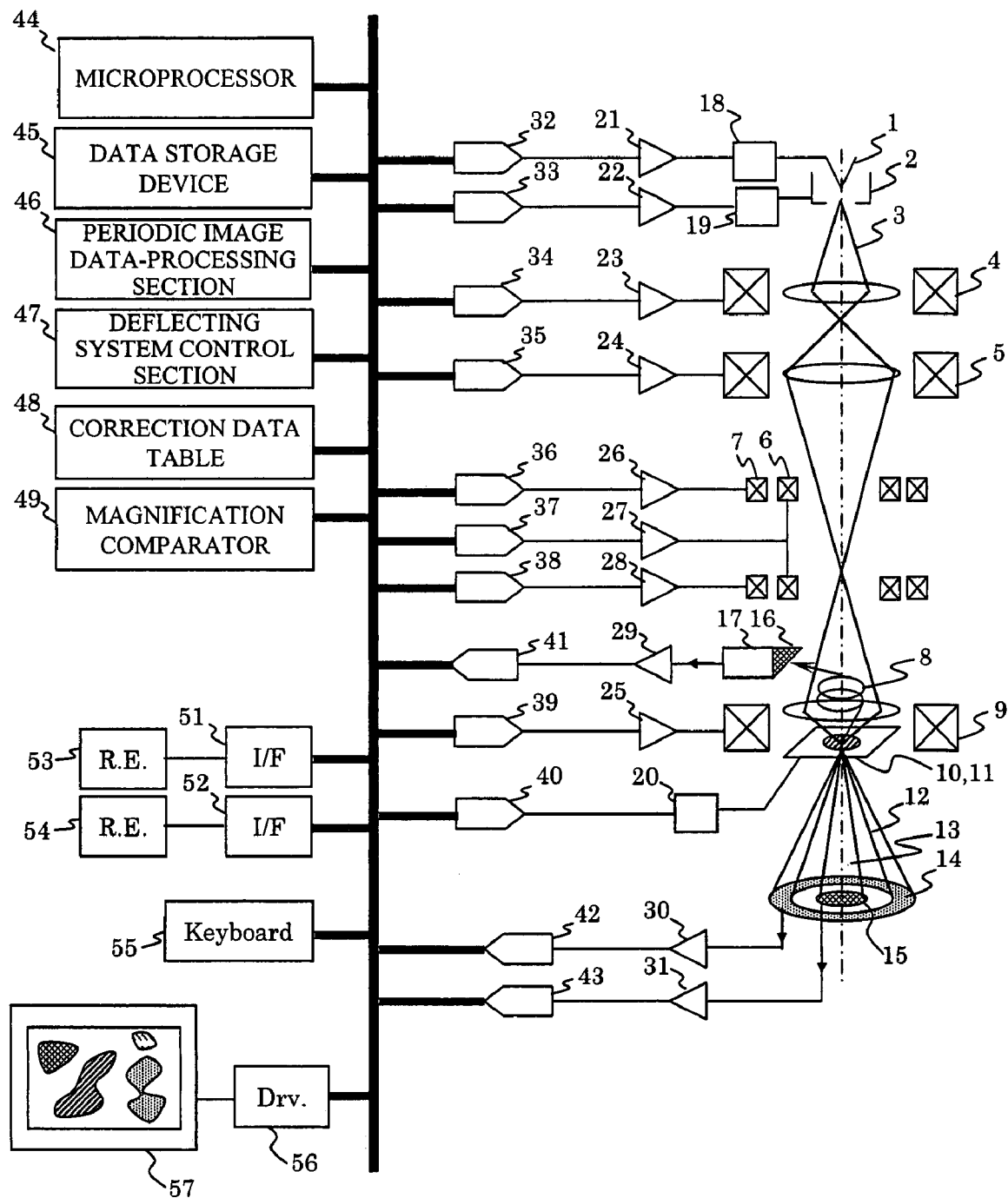
FIG. 1 shows an example of the structure of the charged particle beam equipment of the invention.

FIG. 1 shows a schematic functional block diagram of an example of the charged particle beam equipment of the invention. While the invention can be applied both when the charged particle beam is a positive ion beam and when it is an electron beam, the following embodiment is based on the latter. The condenser electromagnetic lens, object electromagnetic lens, deflector, and scanning device may be based on either the electrostatic method involving electric fields, or the magnetic field method involving magnetic fields; in the present example, the magnetic field method is used. The number of stages of condenser lenses over the sample, and the number of projection electromagnetic lenses, if any, under the sample are of no concern.

With reference to FIG. 1, an electron beam (charged particle beam) 3 emitted by an electron beam source (charged particle beam source) 1 is accelerated by an acceleration electrode 2. The electron beam travels through magnetic fields by a first condenser electromagnetic lens 4, a second condenser electromagnetic lens 5, and an object electromagnetic lens 9, and then impinges a sample 11 held on a sample base 10. As the sample 11 is irradiated with the electron beam 3, the sample 11 and the electron beam 3 interact with each other to produce a secondary electron 8, a sample forward-scattering electron 12, and a sample transmission electron 13, which contain information about the sample. The electron beam 3, as the sample is irradiated therewith, is moved in a scanning motion by a scanning coil 6 disposed symmetrically with respect to the electron ray optical axis. By synchronizing the scanning of the electron beam and the scanning on the screen, a sample magnified image is formed on a display device 57. The secondary electron 8 produced by the sample causes a fluorescent substance 16 to fluoresce. The fluorescence is detected by a photomultiplier tube 17, amplified by a low current amplifier 29, and then taken into a data bus via an ADC 41. While the secondary electron detector comprises a fluorescent substance and a photomultiplier tube in the present example, it may comprise a semiconductor detector such as a multichannel plate. The sample forward-scattering electron 12 is detected by a forward-scattering electron detector 14; the sample transmission electron 13 is detected by a sample transmission electron detector 15. The detectors 14 and 15 may each comprise a combination of a fluorescent substance and a photomultiplier tube, or a semiconductor detector.

Instructions concerning the acceleration voltage, the electron beam extraction voltage, the filament current, and the like are received by DAC 32 or 33 from a microprocessor 44 via the data bus, converted into analog signals, and then set in a charged particle beam source power supply 18 and an acceleration high voltage power supply 19. Based on these instructions, the electron beam source 1 and the acceleration electrode 2 are driven. Conditions concerning lens currents for the first condenser electromagnetic lens 4, the second condenser electromagnetic lens 5, and the object electromagnetic lens 9 are set by the microprocessor 44, based on which an excitation power supply is set for the individual lenses from the DAC 34, 35, or 39, followed by the supply of current to the electromagnetic lenses. The position of the sample 11 is set by the operator operating a rotary encoder 54 to drive the sample base 10, or by driving the sample base 10 in accordance with a sample location drive pattern recorded in a data storage device 45 in advance.

The amount of scan of the sample with the electron beam can be changed as desired by controlling the magnitude of the electric field or magnetic field that is caused to act on the electron beam by a scan mechanism. For example, the magnification of a secondary electron image can be changed by changing the magnitude of the current applied to the scanning coil 6 to thereby change the area on the sample scanned with the electron beam 3. By decreasing the area on the sample scanned with the electron beam, the magnification of the secondary electron image increases; by increasing the area, the magnification decreases.

Figure 2:
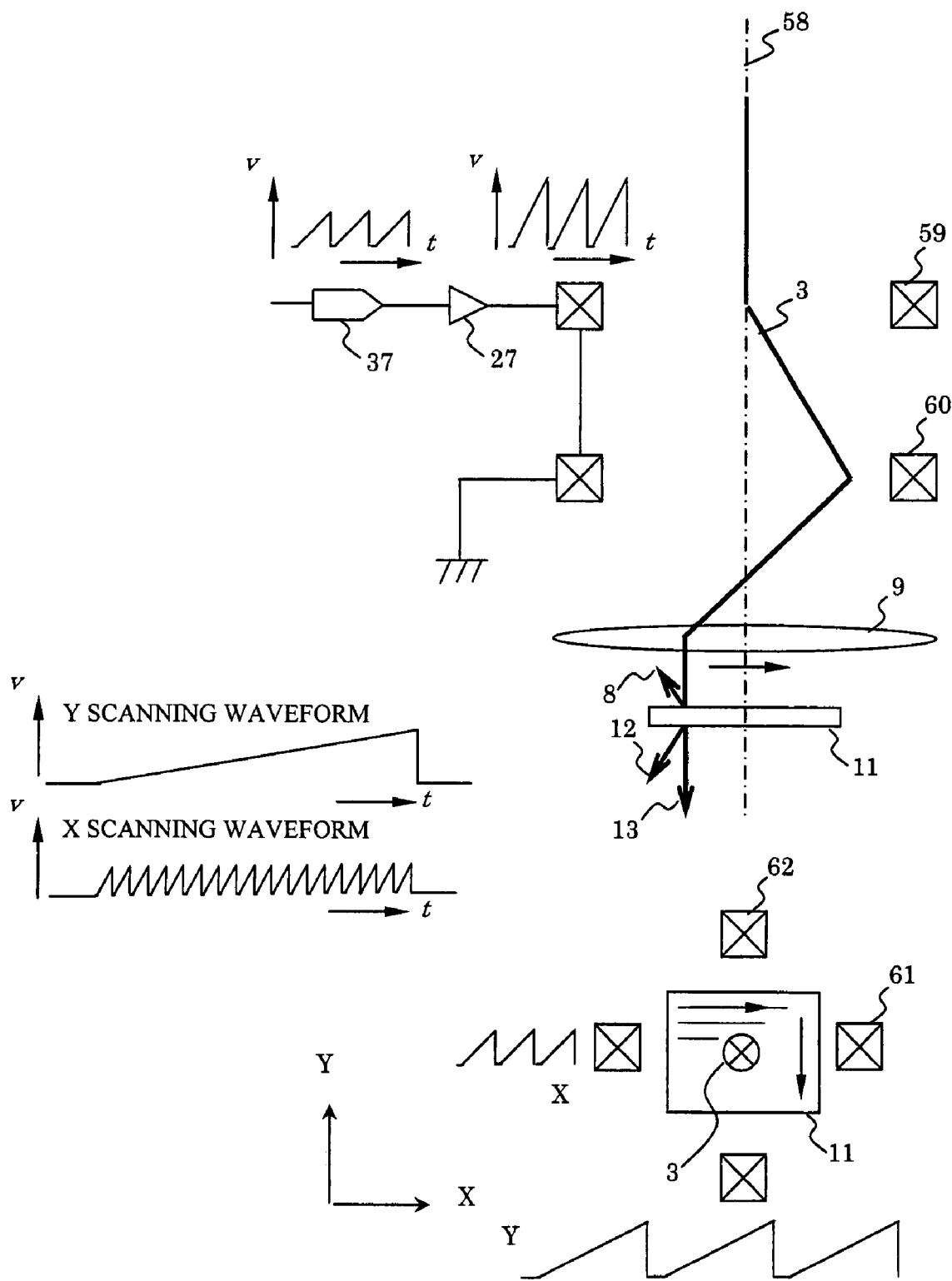
FIG. 2 illustrates the principle of a charged-particle-beam scan mechanism.

FIG. 2 illustrates the principle of an electron beam scan mechanism. The electron beam 3 moves along the electron ray optical axis 58. On the electron ray optical axis, scanning coils 59 and 60 are disposed symmetrically with respect to X and Y. In order to apply the electron beam vertically with respect to the sample, the scanning coils are disposed in two stages, one above and the other below. Sawtooth waveforms are applied to the upper scanning coil 59 and the lower scanning coil 60 so as to cause the electron beam to reach the front-focus position of the object electromagnetic lens 9 on the optical axis, whereby the electron beam becomes incident on the sample vertically and interacts with the sample, producing the secondary electron 8, the sample forward-scattering electron 12, and the sample transmission electron 13. By synchronizing the secondary electron 8, the sample forward-scattering electron 12, and the sample transmission electron 13 with the scan waveform, a sample magnified image is formed. The magnification of the sample magnified image depends on the voltage of the scan waveform applied to the X and Y scanning coils.

Figure 3:
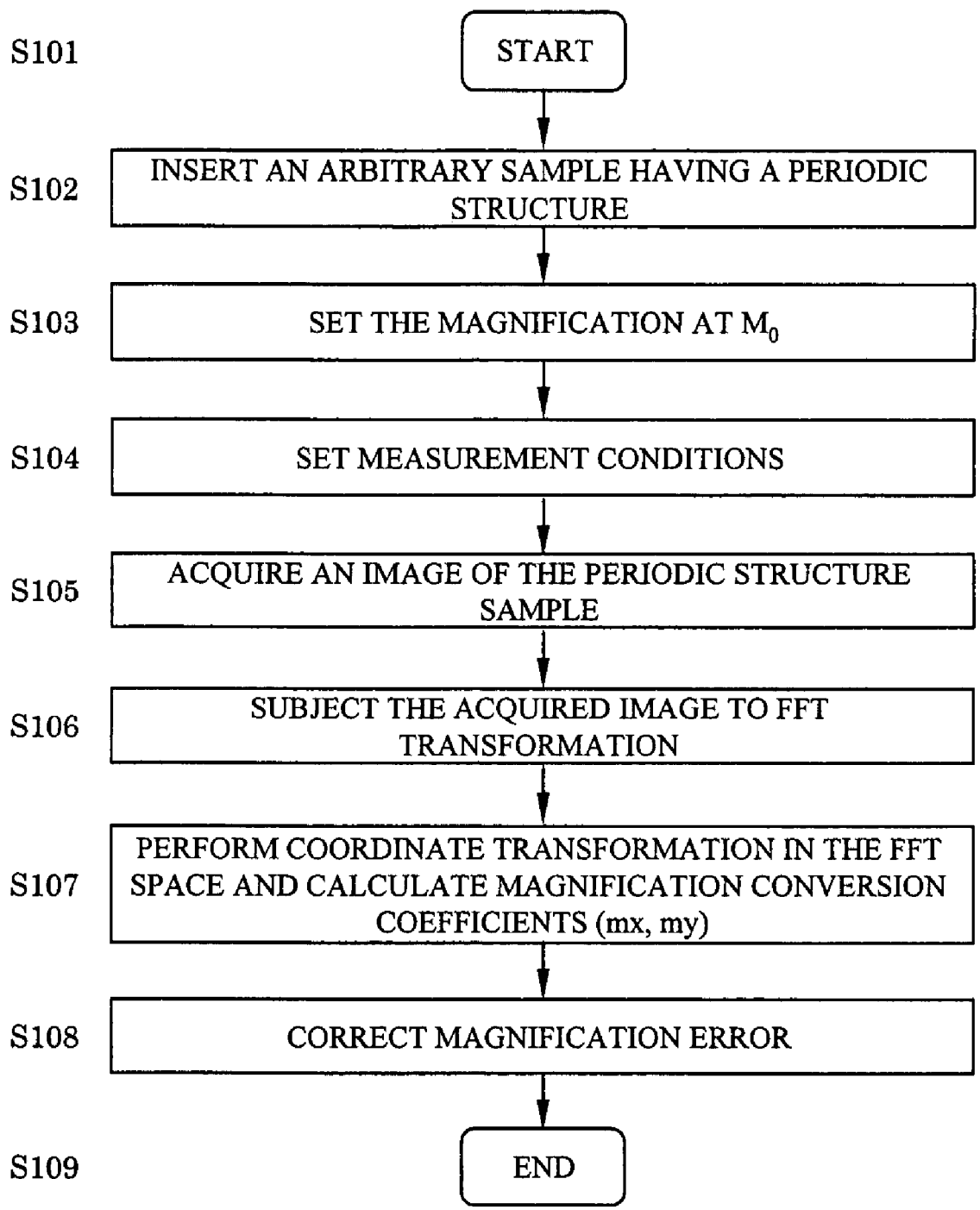
FIG. 3 is a flowchart of a magnification correction method of the invention.

With reference to a flowchart shown in FIG. 3, a method of correcting a size measurement value error using a standard size sample having a periodic structure of a known periodic pitch in the charged particle beam equipment is described. The periodic pitch is described first. A lattice pattern used for magnification calibration has a regular repetition period. The lattice pattern, when observed in a charged particle apparatus, exhibits a bright/dark contrast. The repetition period of such bright/dark contrast is hereafter referred to as a "periodic pitch." A sample having such periodic structure is used as a size standard because if there is a displacement with respect to an absolute standard sample, there should be a displacement of the same degree in a conventional sample (observed sample) if the observation conditions are identical. In the flowchart of FIG. 3, the main driving entity is the microprocessor 44 unless otherwise stated.

Figure 4:
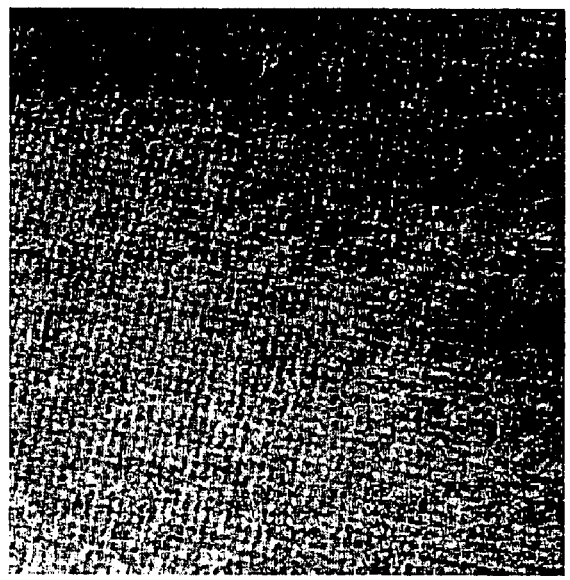
FIGS. 4A and 4B show an example of the result of subjecting gold as a crystal sample to fast Fourier transform (FFT).
Figure 4:
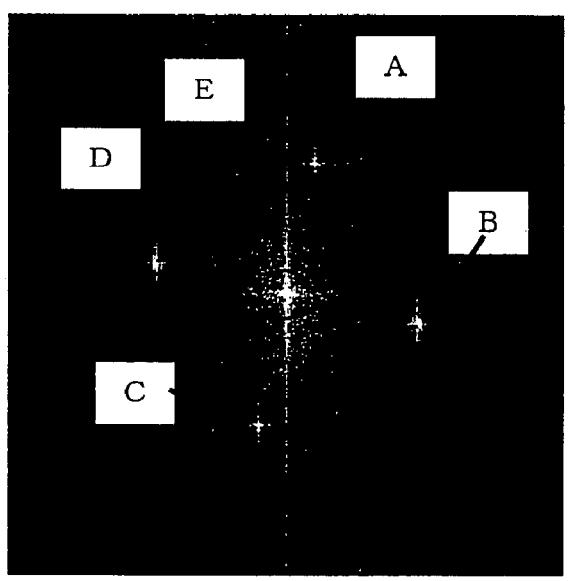
Figure 5:
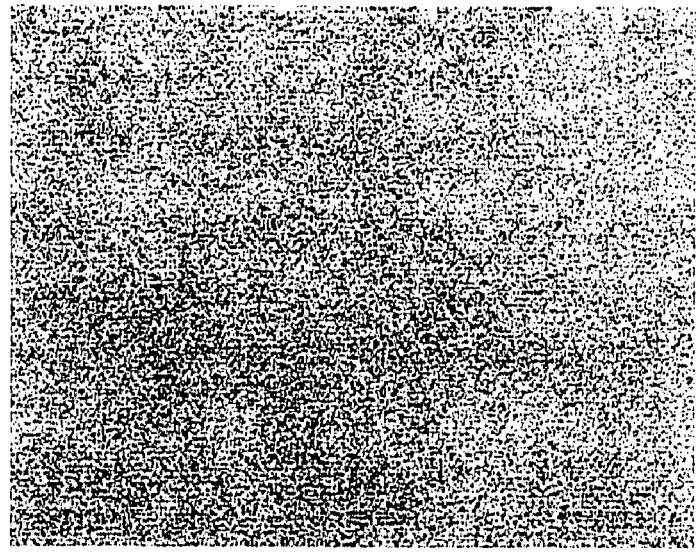
FIGS. 5A and 5B show an example of a sample for the correction of size of the charged particle beam equipment.
Figure 5:
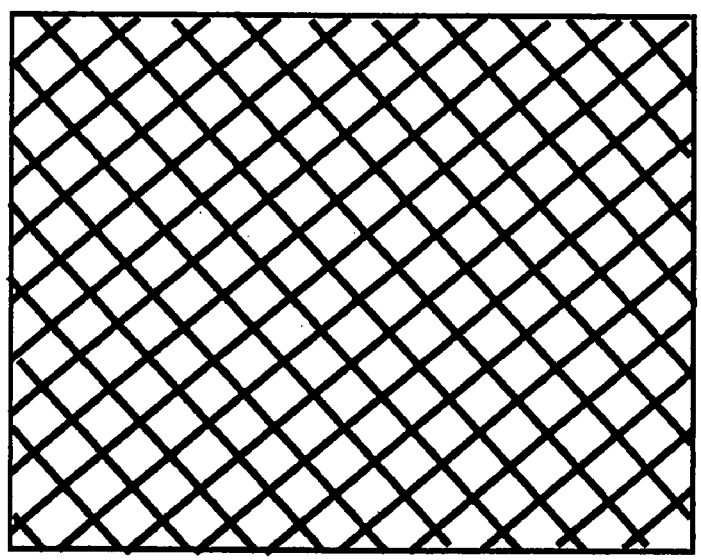

In step S102, an arbitrary standard size sample having a periodic structure with a known periodic pitch is mounted on the sample base, which is then inserted into the electron beam apparatus. FIG. 4 shows a first example of the sample having a periodic structure. FIG. 4A shows a sample magnified image of a single-crystal thin-film sample of gold having the face-centered cubic lattice structure obtained by means of scanning transmission electrons. Lattice fringes of the (200) crystal-face spacing of 0.204 nm of gold are observed. Such samples are characterized in that their sizes are known and their size errors are extremely small compared with errors caused by the apparatus. While the standard size sample comprises a single crystal thin film of gold in the present embodiment, other samples may be used, such as a silicon single-crystal thin-film sample shown in FIG. 5A, or a sample having an artificial lattice pattern with a known size, as shown in FIG. 5B. By using such sample having a periodic structure, it becomes possible to measure an average size in the image plane, so that uniformity in the image plane can be obtained. The sample used for magnification calibration should preferably be a sample having such a structure as to constitute a size standard; in nature, a lattice pattern based on a two-dimensional projection of a crystal is a representative sample. On the other hand, a material can be artificially processed either two-dimensionally or three-dimensionally to prepare a sample having a repetition pattern of a uniform size, and the sample can be used as the standard sample for magnification calibration. Such sample is evaluated using laser optics, X-ray diffraction, or the like to ensure that the size of the prepared lattice pattern is uniform and has a desired size value. For example, a microscale having a two-dimensional lattice pattern formed by etching an Si wafer, which is used for magnification calibration in SEM or STEM, has its size optically measured and managed.

In step S103, the magnification is set to magnification $M_0$ at which the periodic pitch can be observed, and then the voltage applied to the scanning coil is determined. For example, when the aforementioned gold thin-film single-crystal sample is used, an appropriate observation magnification in the range of ×3 million to ×5 million. In the present example, the observation magnification is set to ×4 million. Since observation magnification depends on the image (pixel) size of the magnified image, the specific value of magnification is not limited to the above.

In step S104, measurement conditions necessary for obtaining a magnified image of the sample inserted in step S102 are acquired. The conditions include the acceleration voltage of the electron beam, the amount of irradiation of the sample with the electron beam, the irradiated area, position, and angle, for example. The conditions are entered by the user using a keyboard 55, for example.

In step S105, a magnified image of the sample inserted in step S102 is photographed. When a gold lattice image is used as the size-standard periodic sample in the charged particle beam equipment of FIG. 1, since a sample magnified image based on sample transmission electrons is appropriate, a signal from the sample transmission electron detector is selected as an image signal. Then, an image of the periodic structure is formed in the microprocessor 44 and recorded in the data storage device 45. While the detector of the present example comprises a sample transmission electron detector, this is merely an example and it is possible to use a scattering electron detector.

In steps S106 and S107, periodic information is extracted by the periodic image data-processing section 46, through image operations, from the magnified image of the periodic structure sample stored in the data storage device 45. Thereafter, magnification conversion coefficients ($m_x$, $m_y$) are calculated.

FIG. 4B shows an example where feature quantities of the sample are extracted by the periodic image data-processing section 46 from a fast Fourier transformed (FFT) periodic image. In the present example, information about the periodic structure sample is extracted by means of an FFT. The FFT is used because it is necessary to be aware of the pitch size no matter in which direction the sample is inserted. The FFT processing is performed while adjusting the contrast and brightness of the periodic image stored, in the RAM. For the FFT processing, a square section having $2^n$ pixels is cut out of the sample magnified image. For example, when the sample magnified image has been recorded with the pixel size of 640×480 pixels, the FFT processed area is formed by a $2^8$ pixel area or a $2^7$ pixel area, or 256×256 pixels or 128×128 pixels, respectively.

FIG. 4A shows an image recorded with 1280×960 pixels. FIG. 4B shows the result of performing FFT processing in a square area of 256×256 pixels. The lattice information appears in the form of bright spots with a maximum intensity at a spatial frequency corresponding to the mean value of the period. In the example of FIG. 4B, there are five bright spots A, B, C, D, and E in the FFT area. Bright spot E is produced at the center of the image of the FFT area; it indicates the dc component of the image and has nothing to do with the periodic structure. The significant bright spots are A, B, C, and D, where A and C, and B and D are symmetric to each other with respect to the point at the center of the image of the EFT area. These bright spots A, B, C, and D can be regarded as bright spots that reflect the lattice spacing (atoms in the sample). In the present example, bright spots A and B are extracted, and then magnification conversion coefficients ($m_x$, $m_y$) for the imaging magnification are determined for the X direction and the Y direction of scan individually by coordinate transformation in the FFT spatial domain.

Figure 6:
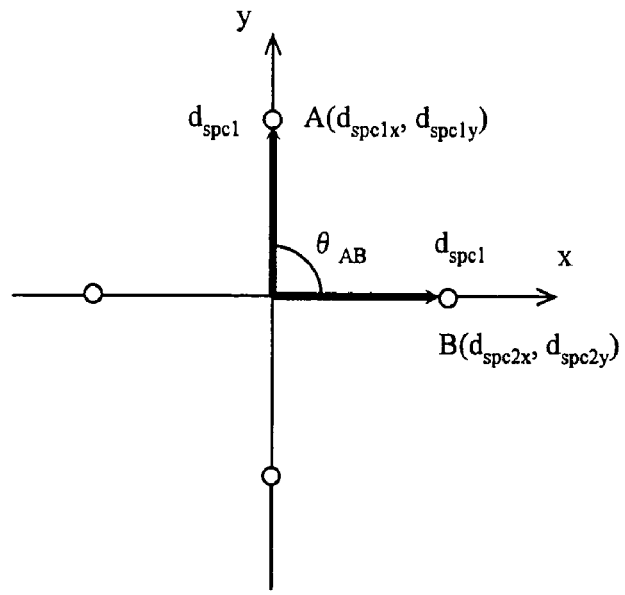
FIGS. 6A and 6B show an ideal coordinate system and a measurement coordinate system, respectively, for gold in the FFT spatial domain.
Figure 6:
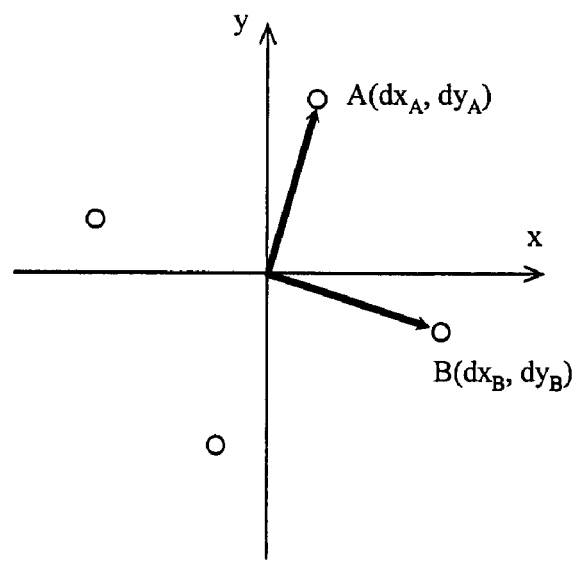

FIG. 6A shows an ideal coordinate system of gold in the FFT spatial domain. FIG. 6B shows a measurement coordinate system. In the ideal coordinate system of FIG. 6A, the angle $\theta_{AB}$ made by bright spots A and B is 90°, and the coordinate positions of bright spots A and B are indicated by the following equations (1) and (2):

$$A(d_{spc1x}, d_{spc1y}) = (0, d_{spc1}) \tag{1}$$

$$B(d_{spc2x}, d_{spc2y}) = (d_{spc1}, 0) \tag{2}$$

where $d_{spc1}$ is the number of pixels corresponding to the ideal (200) crystal-face spacing of gold, which is 0.204 nm; $d_{spc1}$ is calculated by the following equation (3):

$$d_{spc1} = W(\text{pixels}) \times \{L(\text{nm/pixels})/d(\text{nm})\} \times M(\text{times})/M_0 \text{ (times)} \tag{3}$$

where W is the size (pixels) of the FFT processing area, L is the length (nm) per unit pixel, d is the face spacing (nm) of the periodic structure sample, M is the reference magnification (times) that determines the length per unit pixel, and $M_0$ is the imaging magnification.

The magnification conversion coefficients ($m_x$, $m_y$) in the measurement coordinate system of FIG. 6B can be determined by coordinate transformation in the FFT spatial domain. The magnification conversion coefficients ($m_x$, $m_y$) are calculated by the following equations (4) and (5):

$$m_x = [(d_{spc1})^2/\{(dx_A)^2 + (dx_B)^2\}]^{1/2} \tag{4}$$

$$m_y = [(d_{spc1})^2/\{(dy_A)^2 + (dy_B)^2\}]^{1/2} \tag{5}$$

where $dx_A$ is the distance x (pixels) between the center of image and the peak position of bright spot A, $dy_A$ is the distance y (pixels) between the center of image and the peak position of bright spot A, $dx_B$ is the distance x (pixels) between the center of image and the peak position of bright spot B, and $dy_B$ is the distance y (pixels) between the center of image and the peak position of bright spot B. Thus, there is the possibility that the magnification in the X direction may be the same as the magnification in the Y direction; this is because the circuit for scanning in the X direction and the circuit for scanning in the Y direction are independent from each other. The equations (4) and (5) are applied in a case where the crystal structure is the simple face-centered cubic lattice.

In the example of FIG. 4B, W is 256 (pixels), L is 19.84 (nm/pixels), d is 0.204 (nm), M is 10000 (times), and $M_0$ is 4000000 (times), so that $d_{spc1}$ is determined to be 62.24 (pixels) from equation (3). $dx_A$ is 12 (pixels) and $dx_B$ is 60 (pixels), so that magnification conversion coefficient $m_x$ is determined from equation (4) to be 1.017. $dy_A$ is 59 (pixels) and $dy_B$ is −14 (pixels), so that magnification conversion coefficient $m_y$ is determined from equation (5) to be 1.026.

From the magnification conversion coefficients $m_x$ and $m_y$, the magnification errors $\epsilon_x$ and $\epsilon_y$ are calculated from the following equations (6) and (7):

$$\epsilon_x = m_x - 1 \tag{6}$$

$$\epsilon_y = m_y - 1 \tag{7}$$

Figures 7, 8:
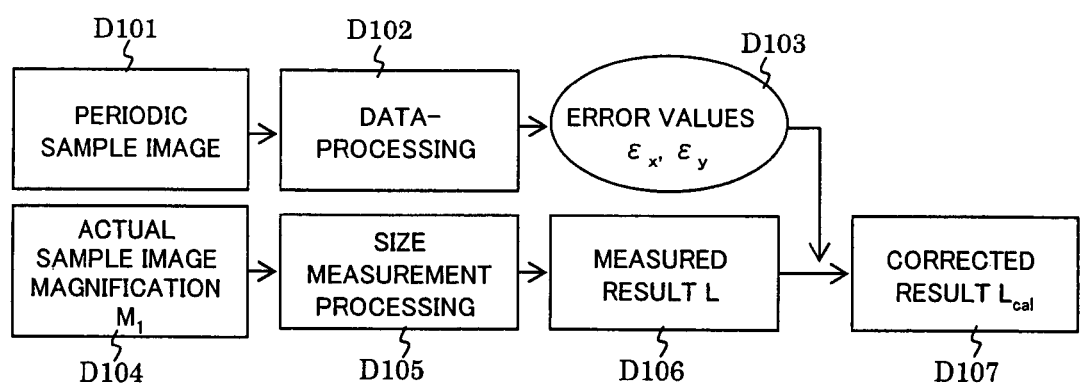
FIG. 7 shows a magnification data table and a correction data table.
FIG. 8 is a block diagram of a method of correcting size of an actual sample measured on an enlarged image thereof, on the basis of a measured magnification error.

The magnification error (of a sample with known structure) thus calculated is stored in the form of a table in the correction data table 48 of FIG. 1 in terms of magnification error or magnification conversion coefficient in the X direction or magnification error or magnification conversion coefficient in the Y direction with respect to display magnification. FIG. 7 shows an example of the correction data table. The charged particle beam equipment stores data concerning the entire information about magnification steps at which magnification error measurement has been performed.

In step S108, the magnification error of the equipment is corrected. The subject of magnification correction may be either the measured value of length with respect to the display image or DAC values outputted to the scanning coils.

In the following, a concrete example of magnification correction using the magnification error determined in steps S101 to S107 is described with reference to FIGS. 8 to 10.

FIG. 8 shows a block diagram of a method of correcting the measured value with respect to the display image. D101 to D102 correspond to S101 to S107 of FIG. 3. Magnification error $\epsilon_x$ is calculated by equation (6) and stored in the data storage device in D103. In D104, an image to be actually evaluated is photographed with magnification $M_1$, and a desired distance within the photographed image is measured in D105. The measured result, $L_1$, contains a magnification error. Magnification $M_1$ is the magnification for which the magnification error has been calculated. The magnification error is corrected by equation (8):

$$\text{Corrected value } L_{cal}(\text{nm}) = \text{Measured value } L_1(\text{nm}) \times (1/(1+\epsilon_x)) \tag{8}$$

The result is outputted in D107. The output data is displayed on the display device of the charged particle beam equipment.

Figure 9:
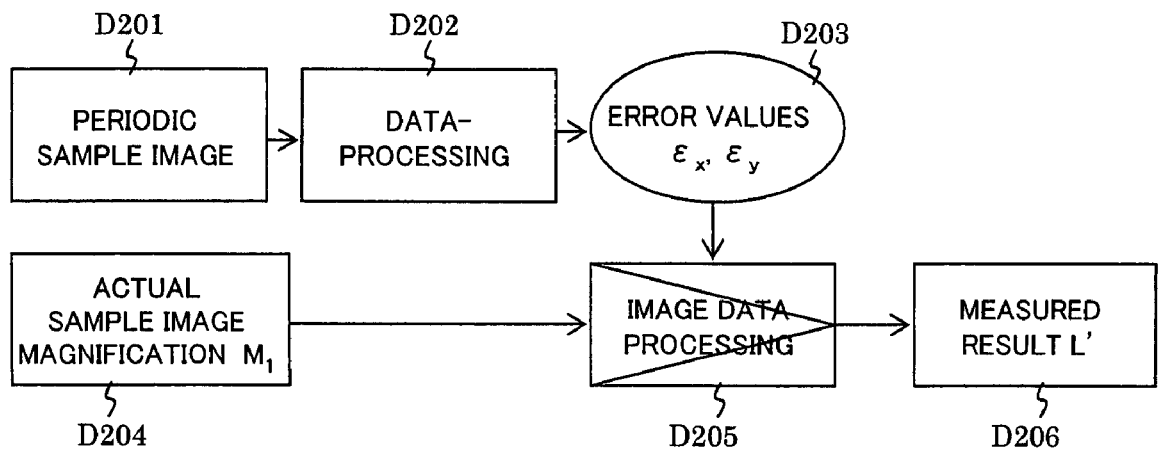
FIG. 9 is a block diagram of a method for magnification correction by image processing of a magnified image of an actual sample on the basis of a measured magnification error.

FIG. 9 shows a block diagram of a method of performing magnification correction by changing the scale of the photographed image. D201 to D203, which correspond to steps S101 to S107 of FIG. 3, illustrate the process of calculating magnification error $\epsilon_x$ according to equation (6) of FIG. 3. In D204, the sample is photographed with magnification $M_1$ for which a magnification error has been calculated. In D203, based on the given magnification error value, the image is increased or decreased in size by image data-processing. In D205, it is necessary that the photographed image has been photographed as a digital image or, if it is an analog image, it is stored as digital data. In D206, the processed image is displayed on the display device as magnification-corrected image and stored in the data storage device.

Figure 10:
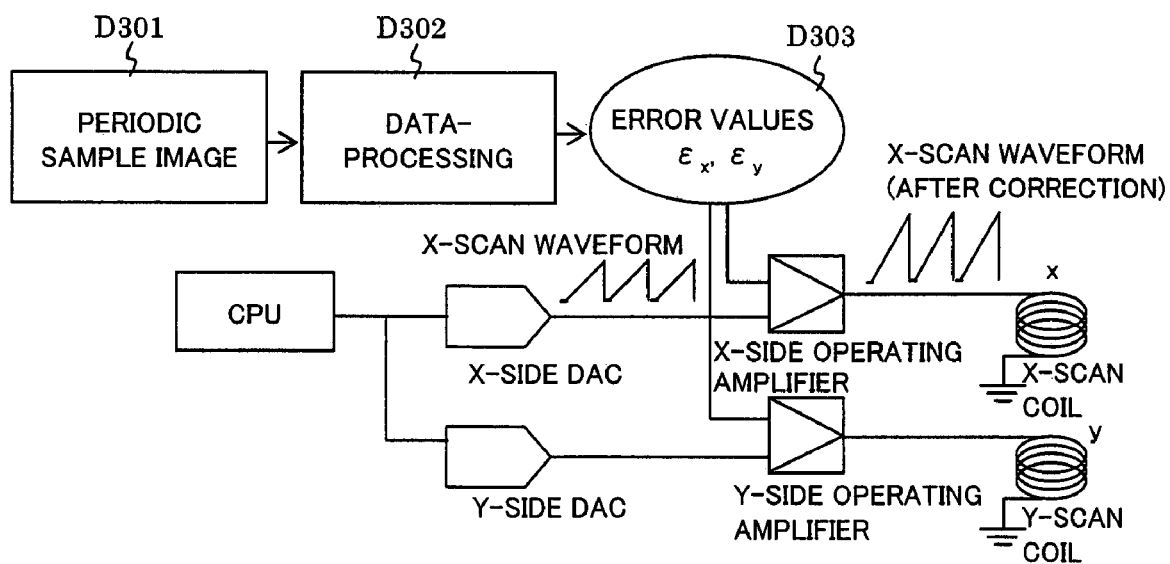
FIG. 10 is a block diagram of a method of correcting the magnification error by correcting a scan waveform, the method involving feeding back a measured magnification error to a charged particle beam scanning system.

FIG. 10 shows a block diagram of a correction method based on a feedback of the determined magnification error to the scanning coil current (voltage) values. Namely, the method involves correcting the crest value (width of the scanned area), i.e., the current (voltage) applied to the scanning coils. In D303, the magnification error is determined. The charged particle beam equipment comprises scanning coils for scanning the electron beam for obtaining a magnified image of the sample, operating devices for providing currents to be applied to the scanning coils, and DAC's. The DAC output values for controlling the current values to be provided to the scanning coils are controlled by equation (9), so as to control the scanning coil current waveforms and correct the magnification.

$$\text{Corrected value } V_{cal} = \text{Scanning coil DAC value } V_{scan} \times (1/(1+\epsilon_x)) \tag{9}$$

By using the present method, it becomes possible to measure magnification errors in both X direction and Y direction simultaneously in one measurement and correct them without the need to eliminate the displacement, if any, in rotation direction between the direction of the periodic structure pattern of a sample having a known periodic structure and the X or Y direction of the sample on an electron image.

What is claimed is:

1. Charged particle beam equipment for irradiating an observed sample with a charged particle beam that is moved in a scanning motion in an X direction and a Y direction to obtain an image of the observed sample, the equipment comprising:
magnification error value calculating means which calculates magnification error values in the X direction and the Y direction by performing coordinate transformation in an FFT spatial domain; and
data-processing means for obtaining correction subject information from the observed sample and correcting it using the magnification error values,
wherein the coordinate transformation in the FFT spatial domain is performed by using a coordinate transformation expression,
wherein the coordinate transformation expression is derived by:
doing a rotation transform with rotation angle θ to an ideal coordinate system obtained by providing the FFT transformation to a standard size sample whose pattern direction of a periodic structure corresponds with the X direction or the Y direction of the image, the periodic structure having a known periodic pitch, and
applying a scaling transformation with magnification (mx, my) to the rotation transformed ideal coordinate system,
wherein the magnification error values are calculated by:
doing the FFT transformation to the image obtained by imaging the standard size sample, and
substituting structure information extracted from the coordinate system of the image in the FFT spatial domain into the coordinate transformation expression.

2. The charged particle beam equipment according to claim 1, wherein the data-processing means comprises:
means for photographing the observed sample at an arbitrary magnification to generate a photographed image;
means for measuring a size of at least a part of the photographed image; and
means for correcting the result of measurement of the size by using a magnification error value corresponding to the arbitrary magnification.

3. The charged particle beam equipment according to claim 1, wherein the data-processing means comprises:
means for photographing the observed sample at an arbitrary magnification to generate a photographed image; and
means for enlarging or reducing a size of the photographed image by using a magnification error value corresponding to the arbitrary magnification.

4. The charged particle beam equipment according to claim 1, wherein the standard size sample comprises a single-crystal thin-film sample having a known crystal structure.

5. The charged particle beam equipment according to claim 1, wherein the standard size sample comprises a sample that is made by artificially processing a material two- or three-dimensionally so as to provide it with a repetition pattern having a uniform size, wherein the size of the pattern is known.

6. Charged particle beam equipment for irradiating an observed sample with an electron beam that is moved in a scanning motion in an X direction and a Y direction so as to obtain an image of the observed sample, the equipment comprising:
magnification error value calculating means for storing magnification error values for the X direction and the Y direction by performing coordinate transformation in an FFT spatial domain; and
data-processing means for obtaining a scan waveform outputted by a scanning coil for the scanning of the observed sample and correcting the scan waveform using the magnification error values
wherein the coordinate transformation in the FFT spatial domain is performed by using a coordinate transformation expression,
wherein the coordinate transformation expression is derived by:
doing a rotation transform with rotation angle θ to an ideal coordinate system obtained by providing the FFT transformation to a standard size sample whose pattern direction of a periodic structure corresponds with the X direction or the Y direction of the image. the periodic structure having a known periodic pitch, and
applying a scaling transformation with magnification (mx, my) to the rotation transformed ideal coordinate system,
wherein the magnification error values are calculated by:
doing the FFT transformation to the image obtained by imaging the standard size sample, and
substituting structure information extracted from the coordinate system of the image in the FFT spatial domain into the coordinate transformation expression.

7. The charged particle beam equipment according to claim 6, wherein the data-processing means controls the scan waveform for the X direction and the scan waveform for the Y direction independently for correction.

8. The charged particle beam equipment according to claim 6, wherein the standard size sample comprises a single-crystal thin-film sample having a known crystal structure.

9. The charged particle beam equipment according to claim 6, wherein the standard size sample comprises a sample that is made by artificially processing a material two- or three-dimensionally so as to provide it with a repetition pattern having a uniform size, wherein the size of the pattern is known.

10. A machine readable storage medium having stored therein a program for controlling charged particle beam equipment for irradiating an observed sample with an electron beam that is moved in a scanning motion in an X direction and a Y direction so as to obtain an image of the observed sample, the program comprising:
a program code for performing an information acquisition step for acquiring correction subject information from the observed sample being irradiated by the charged particle beam apparatus; and
a program code for performing a data-processing step for correcting the correction subject information using a magnification error value stored in magnification error value calculating means which calculates magnification error values for use in moving the electron beam the X direction and the Y direction by performing coordinate transformation in an FFT spatial domain, by doing the FFT transformation to the image obtained by imaging the standard size sample, and substituting structure information extracted from the coordinate system of the image in the FFT spatial domain into the coordinate transformation expression, wherein the coordinate transformation in the FFT spatial domain is performed by using a coordinate transformation expression, derived by:

doing a rotation transform with rotation angle $\theta$ to an ideal coordinate system obtained by providing the FFT transformation to a standard size sample whose pattern direction of a periodic structure corresponds with the X direction or the Y direction of the image, the periodic structure having a known periodic pitch, and applying a scaling transformation with magnification (mx, my) to the rotation transformed ideal coordinate system.

11. The machine readable storage medium according to claim 10, wherein the data-processing step comprises the steps of:

photographing the observed sample at an arbitrary magnification to generate a photographed image;

measuring the size of at least a part of the photographed image; and acquiring a result of the measurement of the size by using a magnification error value corresponding to the arbitrary magnification.

12. The machine readable storage medium according to claim 10, wherein the data-processing step comprises the steps of:

photographing the observed sample at an arbitrary magnification to generate a photographed image; and enlarging or reducing a size of the photographed image by using a magnification error value corresponding to the arbitrary magnification.

13. A machine readable storage medium having stored therein a program for controlling charged particle beam equipment for irradiating an observed sample with an electron beam that is moved in a scanning motion in an X direction and a Y direction so as to obtain an image of the observed sample, the program comprising:

a program code for performing an information acquisition step for acquiring a scan waveform outputted by a scanning coil for the scanning of the observed sample; and a program code for performing a data-processing step for correcting the scan waveform based on a magnification error value stored in magnification error value calculating means which calculates magnification error values for the X direction and the Y direction by performing coordinate transformation in an FFT spatial domain, wherein the coordinate transformation in the FFT spatial domain is performed by using a coordinate transformation expression, wherein the coordinate transformation expression is derived by:

doing a rotation transform with rotation angle $\theta$ to an ideal coordinate system obtained by providing the FFT transformation to a standard size sample whose pattern direction of a periodic structure corresponds with the X direction or the Y direction of the image, the periodic structure having a known periodic pitch, and applying a scaling transformation with magnification (mx, my) to the rotation transformed ideal coordinate system, and wherein the magnification error values are calculated by:

doing the FFT transformation to the image obtained by imaging the standard size sample, and substituting structure information extracted from the coordinate system of the image in the FFT spatial domain into the coordinate transformation expression.

14. The machine readable storage medium according to claim 13, wherein the data-processing step comprises controlling the scan waveform in the X direction and the scan waveform in the Y direction independently for correction.

* * * * *